United States Patent [19]
Tsunekawa et al.

[11] Patent Number: 4,675,535
[45] Date of Patent: Jun. 23, 1987

[54] MULTI-LAYERED SOLID-STATE IMAGE SENSOR FOR THREE-DIMENSIONAL PICTURE IMAGE PROCESSING

[75] Inventors: Shou Tsunekawa; Nozomu Harada, both of Yokohama, Japan

[73] Assignee: Kabushiki Kaisha Toshiba, Kawasaki, Japan

[21] Appl. No.: 792,884

[22] Filed: Oct. 30, 1985

[30] Foreign Application Priority Data

Dec. 6, 1984 [JP] Japan ................... 59-257938

[51] Int. Cl.$^4$ ................. H01J 40/14; H01L 27/14; H01L 31/00
[52] U.S. Cl. .................. 250/578; 250/211 R; 357/30
[58] Field of Search ............... 250/211 R, 211 J, 578; 357/30, 76

[56] References Cited

U.S. PATENT DOCUMENTS

| 3,970,990 | 7/1976 | Carson ........................... 250/578 X |
| 4,025,786 | 5/1977 | Hamilton ........................ 250/578 X |
| 4,053,773 | 10/1977 | Deresh et al. .................. 250/578 X |
| 4,410,804 | 10/1983 | Stauffer .......................... 250/578 |
| 4,431,913 | 2/1984 | Sekimoto et al. ............... 250/211 R |
| 4,581,625 | 4/1986 | Gay et al. ........................ 357/30 |

FOREIGN PATENT DOCUMENTS 56-44262  4/1981  Japan .
0072072   4/1983  Japan ....................... 250/211 R Primary Examiner—Eugene R. LaRoche
Assistant Examiner—David Mis
Attorney, Agent, or Firm—Oblon, Fisher, Spivak, McClelland & Maier

[57] ABSTRACT

A multi-layered solid state image sensor senses a three-dimensional optical image introduced through a lens having a constant focal length and a constant focal depth. The image sensor has a plurality of transparent layers stacked together with reflection preventive coating films sandwiched therebetween. A cell matrix is provided on each of the transparent layers. Cells included in each cell matrix are arranged so as not to overlap each other so that image light can effectively reach the lowermost layer. The cell matrices defining imaging surfaces on the stacked transparent layers become operative simultaneously for image sensing. Therefore, just-focused image planes at different focal points are formed on the cell matrices.

4 Claims, 7 Drawing Figures

MULTI-LAYERED SOLID-STATE IMAGE SENSOR FOR THREE-DIMENSIONAL PICTURE IMAGE PROCESSING

BACKGROUND OF THE INVENTION

The present invention relates to imaging devices, and, more particularly, to an image sensing device which receives incident light so as to three-dimensionally sense an object.

In conventional three-dimensional picture image processing, when an object is three-dimensionally sensed, a lens is moved forward or backward along the optical axis with respect to an imaging device. Thus, a plurality of planar images which are focused at different object focal points before and after a portion of interest of an object can be sequentially sensed by using a normal imaging device having one focal surface, such as a solid state imaging device. In this case, the lens used has a relatively small focal depth, so that a peripheral image portion, i.e., an image in a region other than a clearly focused image portion included in an image incident on a focal surface of the imaging device is greatly out of focus. Based on differences in a focused state, only a focused image portion is extracted from a sensed image.

When a lens is moved, a focal point in an object space is moved, and a focused image region in the sensed image is changed upon this movement. Therefore, if the lens is moved stepwise at a constant pitch, a plurality of focused images corresponding to object distances at equal intervals can be obtained. If image processing is performed so as to overlap these image data in accordance with the distance over which the lens is moved, three-dimensional image data of an object of interest can be reconstructed. It can be said that such recognition of three-dimensional image data is similar to that when three-dimensional topography of a mountain is captured by overlapping images, each representing the contour of the mountain along contour lines at equal intervals.

The above-mentioned three-dimensional image reconstruction technique applies to the case wherein a micro object which can be microscopically observed is to be three-dimensionally apprehended to a high degree of precision. This technique can also be applied to the eyes of an automatic assembly robot which can both automatically recognize objects conveyed by a belt line at various heights, and select a target object so as to mount predetermined parts thereon. In this case, according to the conventional three-dimensional image reconstruction technique, since the lens is generally moved so as to sequentially sense a plurality of images by a single image sensor, extra time is required to obtain a final three-dimensional image. Particularly when the conventional technique is applied to a microscopic image field, it is very difficult to move a lens at high speed because a bright, high-magnification lens is large and heavy. As a result, three-dimensional image processing speed is further degraded.

In order to overcome such a drawback, a plurality of optical paths can be provided so as to simultaneously sense a plurality of images by a single solid state imaging device. However, with this method, the arrangement of the imaging device as a whole becomes complex, and drive control for image reconstruction of the images sensed by the imaging device becomes extremely cumbersome, thus preventing practical application.

SUMMARY OF THE INVENTION

It is, therefore, an object of the present invention to provide a new and improved solid state image sensing device which can perform high speed three-dimensional image processing of an object.

The solid state imaging device of the present invention senses a three-dimensional optical image incident thereon through a lens having a constant focal length and a constant focal depth. The imaging device comprises a multi-layered solid state image sensor having a plurality of image sensing substrates. These image sensing substrates are stacked along the optical axis of the lens, and form a plurality of parallel focal surfaces for an optical image. The image sensing substrates become operative simultaneously so as to sense the optical image introduced through a lens, and generate image pickup signals which represent just-focused image planes on the focal surfaces of a plurality of object points positioned at different object distances along the optical axis.

BRIEF DESCRIPTION OF THE DRAWINGS

The present invention is best understood by reference to the accompanying drawings, in which.

DETAILED DESCRIPTION OF THE PREFERRED EMBODIMENTS

Figure 1:
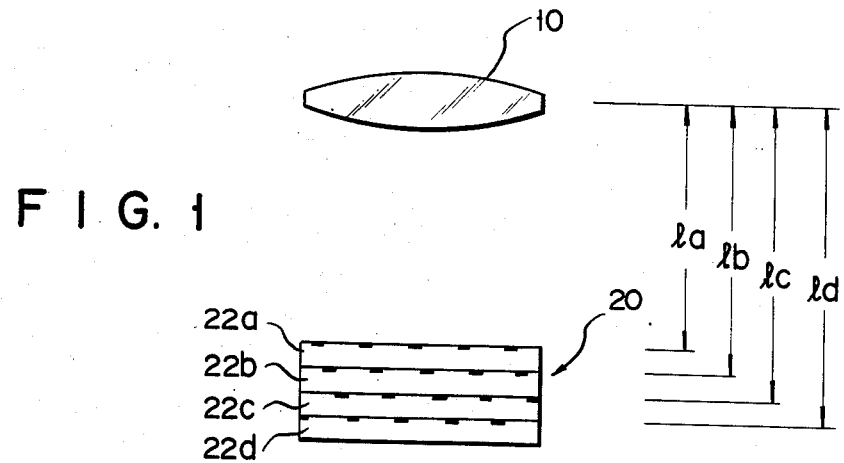
FIG. 1 is a diagram schematically showing a main part, i.e., a multi-layered solid state image sensor and a lens of a three-dimensional solid state image sensing device according the first embodiment of the present invention.

FIG. 1 shows an arrangement of a main part of a three-dimensional imaging device according to one preferred embodiment of the present invention. Reference numeral 10 denotes an incident lens. An optical image is introduced into a multi-layered solid state image sensor 20 of the present invention through the lens 10. The lens 10 is fixed, and the relative distance between the lens 10 and the sensor 20 is constant. The lens 10 has a predetermined constant focal length and a constant focal depth. Since the set focal depth of the lens 10 is small, an optical image formed on each image sensing substrate 22 has a relatively large out-of-focus level around a just-focused image portion.

The sensor 20 comprises a multi-layered charge coupled device having a plurality of image sensing substrates 22a, 22b, 22c and 22d stacked along the optical axis of the lens 10. (It is to be noted that suffixes a, b, c and d are used to correspond to the substrates to be stacked, and that, when there is no need to distinguish the stacking order in the following discription, the suffixes are dropped.) Therefore, the sensor 20 forms a plurality of parallel focal surfaces. That is, referring to FIG. 1, when the sensor 20 is arranged behind the lens 10, it is considered that parallel focal surfaces are present at distances la, lb, lc and ld from the lens 10 so as to correspond to the positions of the substrates 22a, 22b, 22c and 22d. It is considered that the intervals of these focal substrates correspond to the thickness of the substrates 22.

Figure 2:
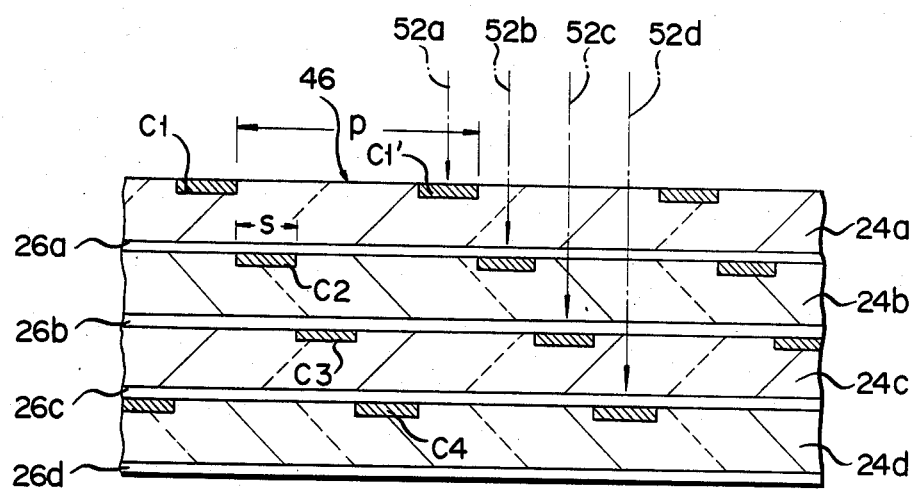
FIG. 2 is an enlarged sectional view of the multi-layered solid state image sensor of the present invention, provided in the device shown in FIG. 1.

As shown in an enlarged view of FIG. 2, each substrate 22 has a transparent layer 24 made of, e.g., glass, sapphire or the like, and a plurality of image sensing cells (picture elements) 26 formed on the layer 24 and made of a photoconductive material such as amorphous silicon or cadmium sulfide (CdS). Coating films 26a, 26b and 26c are provided between each two adjacent image sensing substrates 24a and 24b, 24b and 24c, and 24c and 24d. When an optical image transmitted through a transparent layer of the substrate 24 on the corresponding coating film 26 is incident on the transparent layer of the underlying substrate 24, the coating layer 26 serves as a reflection preventive layer for eliminating or preventing undesirable reflection of light. Effective components of the optical image incident on the underlying substrate 24 can be increased by means of each reflection preventive layer 26.

Figure 3:
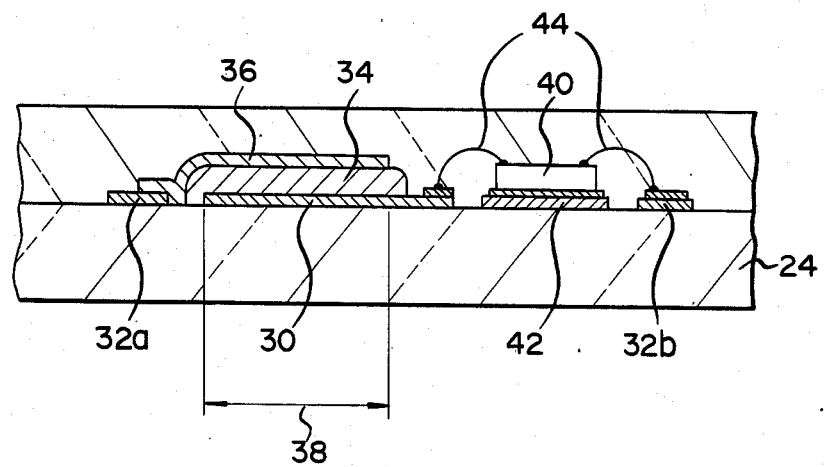
FIG. 3 is a sectional view of a cell formed on each image sensing substrate of the solid state image sensor of FIG. 2.

FIG. 3 shows a sectional structure of each cell C formed on each transparent substrate 24. In FIG. 3, a sectional structure of one cell 26 formed on the specific substrate 24 is shown. A cell electrode layer 30 made of a conductive material (metal) is formed on the transparent layer 24 so as to define one cell region. Wiring patterns 32a and 32b realizing electrical connection for desired signal transmission are also formed on the transparent layer 24. A photoconductive layer 34 made of a photoconductive material such as amorphous silicon or cadmium sulfide (CdS) is formed on the electrode layer 30. An electrode layer 36 is formed so as to be connected to the wiring pattern layer 32a and to cover the photoconductive layer 34. The paired cell electrode layers 30 and 36 sandwiching the layer 34 therebetween define an effective cell region 38. Note that a one-chip LSI 40, consisting of a cell driving circuit for controlling image sensing operation of this specific image sensing substrate cell matrix, is fixed on a mount layer 42 formed on the transparent layer 24. Reference numeral 44 denotes bonding wires for electrically connecting, between the LSI 40, the cells and the wiring patterns.

The cells C formed on each transparent substrate 24 are arranged in substantially a matrix format, and are spaced apart from each other. It should be noted that the cell matrices on the transparent layers 24 of the stacked substrates 22 are aligned so as not to vertically overlap one another, and so as to minimize (preferably to completely remove) a non-imaging region (i.e., a region which cannot sense a transmitted light component even after the light component of the incident light is transmitted through all the substrates).

Figure 4:
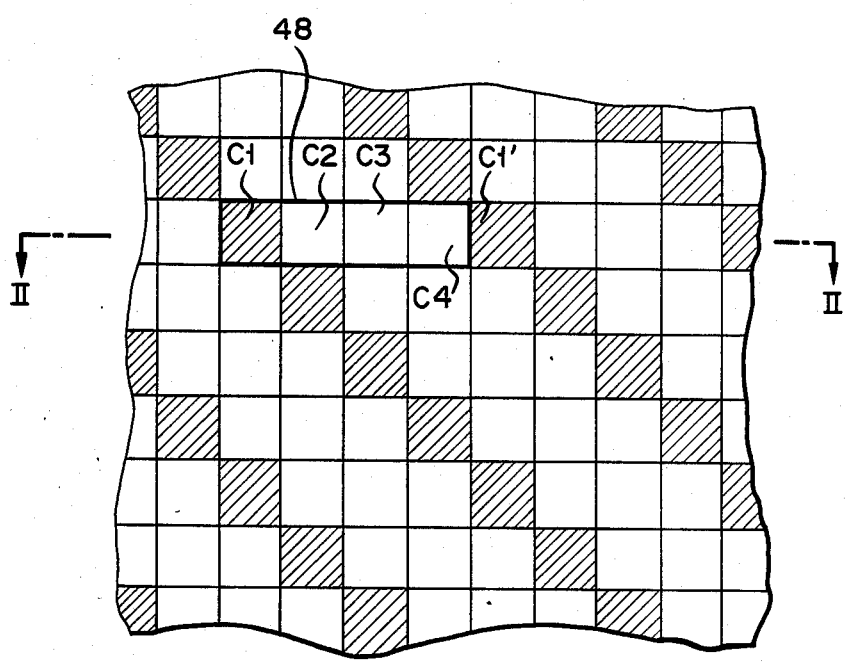
FIG. 4 is a diagram schematically showing a planar cell arrangement of the solid state image sensor of FIG. 2, wherein cell regions formed on vertically stacked sensing substrates are arranged so as not to overlap each other.

According to this embodiment, on each transparent layer 26 a constant cell pitch p is set, but positions of the opposing cells are sequentially shifted by a size of the cell toward the lower layers, as shown in FIG. 2. In this case, if the size of one cell is indicated by "s", the cell pitch p on each transparent layer 26 is p=4s. In other words, a window region 46 between two neighboring cells C1 and C1' on the uppermost transparent layer 24a serves as a common light introduction window with respect to cells C2, C3 and C4 formed, respectively, on the stacked layers 24b, 24c and 24d, and shifted from each other. With this arrangement, incident light components 52a, 52b, 52c and 52d are effectively introduced onto the cells C1, C2, C3 and C4 on the corresponding image sensing substrates without being shielded by other cells, as shown in FIG. 2. As can be seen from the plan view of FIG. 3, the cell matrices provided on the stacked transparent layers 24 are arranged so as not to overlap each other, and to minimize a "gap" corresponding to a non-imaging region. Referring to FIG. 4, each hatched square region represents a cell formed on the uppermost transparent layer 24a. As is apparent from a comparison between FIGS. 4 and 2, the sectional view of FIG. 2 is taken along a line II—II of the plan view of FIG. 4. In order to visually distinguish the four cells C1 to C4 used in the above description, the cells are encircled by a bold line 48 in FIG. 4.

Figure 5:
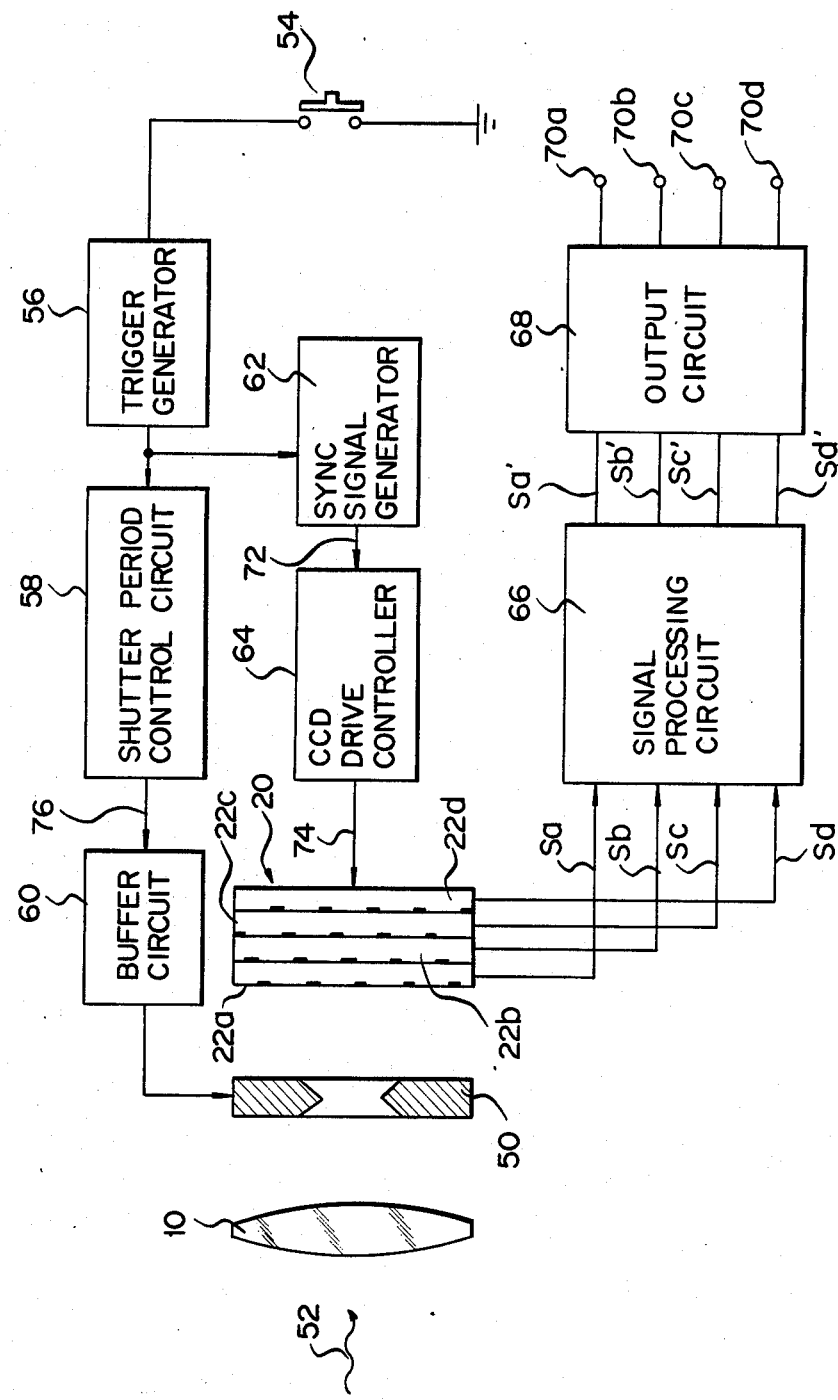
FIG. 5 is a block diagram showing the overall arrangement of the three-dimensional imaging system incorporating a stationary lens and the multi-layer solid state image sensor of the present invention.

FIG. 5 is a block diagram showing a schematic arrangement of the overall three-dimensional imaging system incorporating the multi-layered solid state sensor 20. The same reference numerals in FIG. 5 denote the same parts as in FIG. 1, and a detailed description thereof will be omitted.

A shutter mechanism 50 is provided between the lens 10 and the sensor 20. Therefore, the sensor 20 receives incident light 52 through an aperture of the mechanism 50. A release button (i.e., an imaging start button) 54 is connected between a trigger generator 56 and a ground. The generator 56 is connected to the mechanism 50 through a shutter period control circuit 58 for controlling an open/close operation of the mechanism 50, and through a buffer circuit 60. The generator 56 is further connected to the multi-layered charge coupled device 20 through a sync signal generator 62 and a CCD drive controller 64. Imaging signals Sa, Sb, Sc and Sd from the stacked image sensing substrates 22a, 22b, 22c and 22d of the device 20 are connected to output terminals 70a, 70b, 70c and 70d through a signal processing circuit 66 including amplifiers (not shown), and an output circuit 68. Therefore, the signals Sa, Sb, Sc and Sd from the substrates 22a, 22b, 22c and 22d, which are simultaneously imaged, are subjected to independent signal processing through the circuit 66, thus obtaining final image outputs. The controller 64 serves to control the simultaneous imaging operation of the device 20 in response to a sync signal 72 from the generator 62.

When a gate control signal 74 having pulses which change from low logic level to high logic level is supplied, in synchronism with one frame period defined in accordance with, e.g., an NTSC television system, to the field shift gates (known as FSGs to those skilled in the art) of cells arranged on each image sensing substrate 22 of the sensor 20 in a matrix form, signal charges accumulated on the cell matrix of the substrates 22 of the sensor 20 during this period are transferred to known vertical transfer shift registers (not shown), and then transferred to the circuit 66. For example, in the case of a movie camera such as a VTR camera, when an object is continuously sensed so as to sequentially obtain images of respective fields, the high level pulses of the gate control signal are repeatedly generated for every field period included in each frame period, and are simultaneously supplied to the FSGs of the stacked cell matrices. On the other hand, in order to form an instantaneous still image as in the case of an electronic still camera, only two generated pulses are required before and after a frame period for defining the frame period. In both cases, a pulse width is determined in each cell matrix so as to correspond to a time required for transferring signal charges from sensing portions to the corresponding vertical shift registers. According to this embodiment, the pulse width is set to fall within a range between 1 msec and 10 msec.

In order to open/close the shutter mechanism 50, the circuit 58 generates a shutter control signal 76. The signal 76 has a pulse component which is changed to a high logic level during a designated period corresponding to an imaging period. In response to the signal 76, the mechanism 50 is opened during the designated period. When a still image is to be formed, a pulse width of the signal 76 is selected to be, e.g., about 1 msec. This pulse width of the signal 76 is longer than that of the signal 74. Therefore, the signal charge transfer from the sensing portions of each cell matrix to the corresponding vertical shift registers is completed during open control of the mechanism 50. In this manner, after the mechanism 50 is opened, the pulse of the signal 74 is generated, and, before the mechanism 50 is closed, the circuit 58 and the generator 62 are synchronized by the generator 56 so as to complete a read operation of signal charges in all the cell matrices.

A basic operation mode of the three-dimensional image sensing device according to the embodiment of the present invention having the above arrangement, will now be described with reference to FIG. 5. Upon depression of the button 54, the signal 76 is generated from the circuit 58 and supplied to the mechanism 50 through the buffer circuit 60. The shutter mechanism 50 is opened during a given period determined by the pulse width of the signal 76. As a result, the optical image 52 is incident on the multi-layered image sensor 20 through the lens 10 and the aperture of the mechanism 50.

The lens 10 has a specific focal length and a small focal depth, and is fixed at a constant distance from the sensor 20. Therefore, a plurality of just-focused image planes at different focal points in an object space are formed on the stacked image sensing substrates 22a, 22b, 22c and 22d of the sensor 20 by means of the lens 10. In this case, since the substrates 22a, 22b, 22c and 22d are spaced apart from the rear surface of the lens 10 by the distances la, lb, lc and ld, respectively, the images formed on the substrates 22a, 22b, 22c and 22d represent, accordingly, object images at a plurality of different and just-focused distances (object distances) in front of the lens, as caused by the differences in lens distances (la, lb, lc and ld) of the substrates 22 and determined by the focal length of the lens 10. In other words, a plurality of two-dimensional object images aligned at different focal points along the optical axis of the lens of a three-dimensional object positioned before the lens 10 are formed on the substrates 22.

In this case, as shown in FIG. 2, since the cell matrices formed on the substrates 22 are shifted so as not to vertically overlap each other, an optical image 52b incident on the second image sensing substrate 22b is transmitted through the transparent layer 24a and the coating film (reflection preventive layer) 26a having a low reflection factor, and reaches the cell matrix on the substrate 22b. An optical image 52c incident on the third substrate 22c is transmitted through the transparent layers 24a and 24b of the substrates 22a and 22b and coating films 26a and 26b, and then reaches the cell matrix on the substrate 22c. Similarly, an optical image 52d incident on the substrate 22d is transmitted through the transparent layers 24a, 24b and 24c of the overlying three substrates 22a, 22b and 22c and the coating films 26a, 26b and 26c, and reaches the cell matrix on the substrate 22d.

In response to the signal 72 generated by the generator 62 (which is operated in synchronism with the operation of the circuit 58 by the generator 56), the controller 64 controls a simultaneous imaging operation of the sensor 20. When the signal 74, synchronous with one frame period, is supplied from the controller 64, the signal charges accumulated on the cell matrix sensing regions on the substrates 22a, 22b, 22c and 22d are simultaneously read out. Thus, the output imaging signals Sa, Sb, Sc and Sd from the substrates 22a, 22b, 22c and 22d are supplied to the signal processing circuit 66. In addition to the normal image processing operation performed in response to the imaging signals from the substrates 22, the circuit 66 has a function to extract just-focused image components from each of the signals Sa, Sb, Sc and Sd from the substrates 22a, 22b, 22c and 22d. Therefore, imaging signals Sa', Sb', Sc' and Sd', indicating just-focused image components at different focal points of the object, are supplied to the output terminals 70a, 70b, 70c and 70d through the circuit 68, respectively. By using these output signals, a three-dimensional image can be obtained.

According to the present invention, a plurality of image planes required for forming a three-dimensional image of an object can be obtained without mechanically moving a lens along the optical axis. Therefore, when the multi-layered image sensor 20 of the present invention is used, high-speed three-dimensional image processing can be achieved. Furthermore, a plurality of image planes required for forming a three-dimensional image of an object are simultaneously read out from the sensor 20, and just-focused components can be extracted by the signal processing circuit in real time. Therefore, unlike a conventional method wherein image planes are sequentially formed, since an after image erasing interval of each image plane can be maintained for as long as desired, image quality can be improved.

Figure 6:
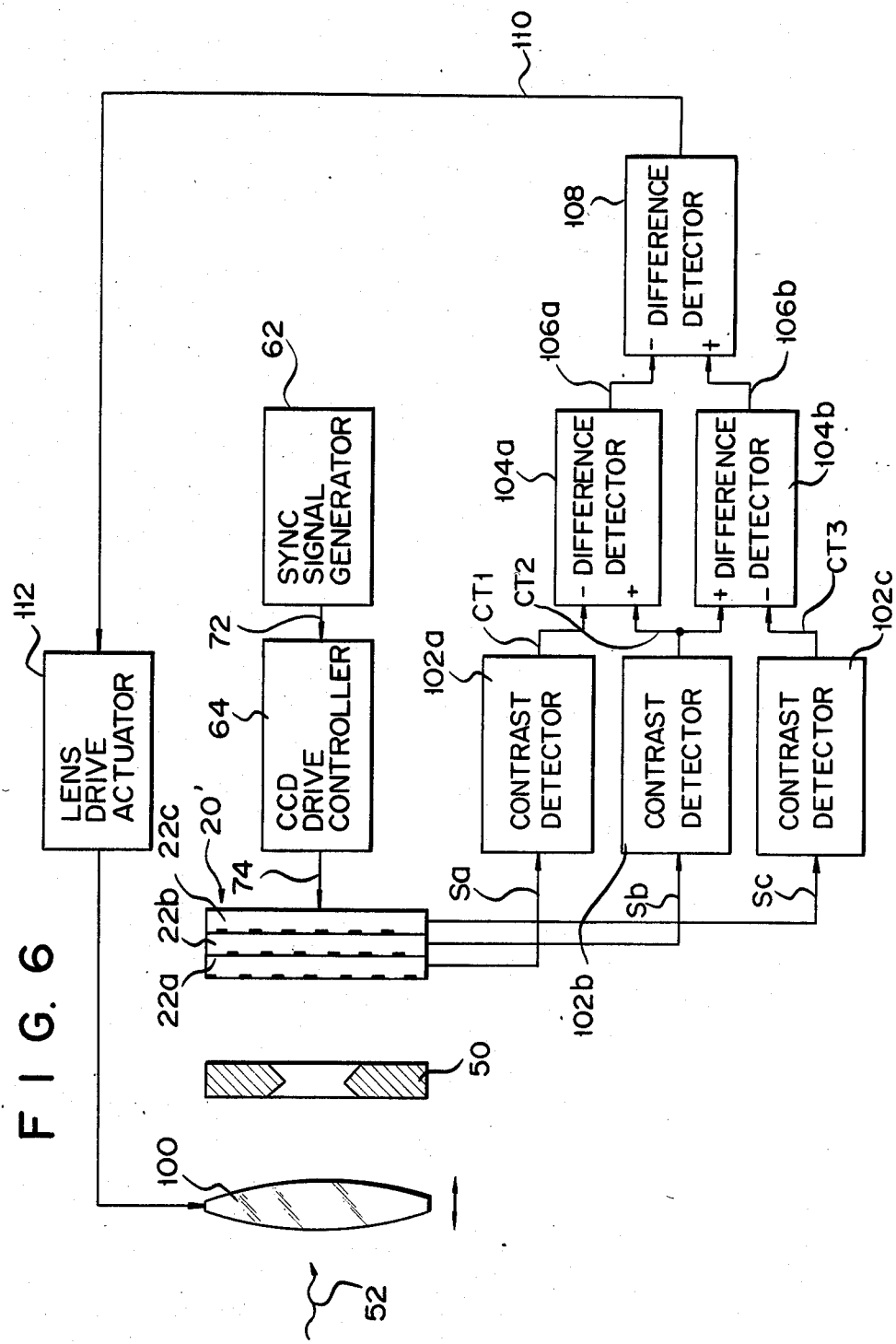
FIG. 6 is a block diagram of an auto-focusing apparatus comprising a lens that can move backward and forward along the optical axis, and the multi-layered solid state image sensor of the present invention.

FIG. 6 shows, as an application of the present invention, an auto-focusing apparatus using a lens 100 which is movable backward and forward along the optical axis, and the above-mentioned multi-layered image sensor 20 of the present invention. Note that in the circuit diagram of FIG. 6, the circuit arrangement of the shutter mechanism 50 is omitted for the sake of simplicity, but that it is substantially the same as that shown in FIG. 5. The same reference numerals in FIG. 6 denote the same parts as in FIG. 6, and a detailed description thereof is omitted.

According to the auto-focusing apparatus of FIG. 6, a solid state image sensor 20' having three-layered image sensing substrates 22a, 22b and 22c is used. Since each image sensing substrate has basically the same arrangement as that of the image sensor 20 shown in FIGS. 1 to 5, the same reference numerals (22a, 22b and 22c) are used in FIG. 6.

Imaging signals Sa, Sb and Sc, generated from the cell matrices on the substrates upon reception of image light 52 incident on the sensor 20' through the lens 100 when the mechanism 50 is opened, are supplied to first, second and third contrast detectors 102a, 102b and 102c, respectively. The detectors 102a, 102b and 102c detect contrast levels of the signals Sa, Sb and Sc so as to generate contrast detection signals CT1, CT2 and CT3 (the contrast level can be calculated by obtaining difference/sum of the imaging signals, for example). The outputs of the detectors 102a and 102b are connected to the inverting and non-inverting inputs of a first difference detector 104a including a known differentiator. The outputs of the detectors 102b and 102c are connected to the inverting and non-inverting inputs of a second difference detector 104b. Each detector 104 detects a difference between two contrast signals CT1 and CT2 (or CT2 and CT3) supplied thereto so as to generate a contrast difference signal 106. The two contrast difference signals 106a and 106b are supplied to a difference detector 108 at a final stage.

The detector 108 detects a difference between the output signals from the detectors 104a and 104b, and supplies a signal 110 representing the difference to a lens drive actuator 112 as an auto-focusing signal. The actuator 112 responds to the signal 110 so as to move the lens 100 backward or forward to thereby automatically focus an image of a portion of interest of an object on the intermediate substrate 22b.

The contrast level is detected in accordance with the theory that the contrast of an object image becomes highest at a just-focused image portion. In accordance with the relationship between differences $D1$ ($=CT2-CT1$) and $D2$ ($=CT2-CT3$) in contrasts calculated by the detectors 104, it can be quickly determined whether the focal point of the lens 100 is in front of or behind the imaging surface on the intermediate image sensing substrate 22b. For example, if relation $D1 < D2$ is satisfied, it is detected that the focal point of the lens 100 is in front of the imaging surface of the substrate 22b (a curve indicating the focal point is indicated by reference numeral 114 in FIG. 7). Note that in FIG. 7, "1a", "1b" and "1c" indicate positions of the imaging surfaces of the substrates 22a, 22b and 2c.

Figure 7:
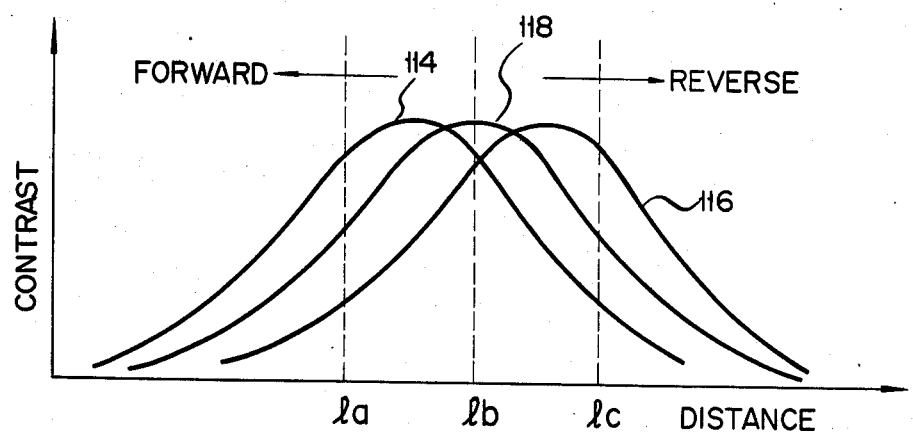
FIG. 7 is a graph showing characteristic curves indicating a contrast distribution which changes in accordance with the distance, i.e., a focal point of the lens of the auto-focusing apparatus shown in FIG. 6.

However, when $D1 > D2$, it is detected that the focal point of the lens 100 is behind the imaging surface on the substrate 22b (a curve indicating the focal point is indicated by reference numeral 116 in FIG. 7). When the lens 100 is moved backward or forward by the actuator 112 in accordance with the absolute value and polarity of a difference so as to compensate for that difference, the relation $D1=D2$ is finally satisfied, and auto-focusing is completed (in this case, a curve indicating the focal point is indicated by reference numeral 118 in FIG. 7). In this manner, according to the auto-focusing apparatus described above, an object image focused on a portion of interest of an object can be easily formed on an imaging surface of an intermediate substrate 22b.

Although the present invention has been shown and described with reference to particular embodiments, various changes and modifications which are obvious to a person skilled in the art, and to which the invention pertains are deemed to lie within the scope of the invention. For example, the number of stacked layers of an image sensor can be set in accordance with a specification, and the arrangement of light-receiving element regions (cells) can be determined in accordance with the number of the stacked layers. When an amount of light incident on an underlying image sensor through a transparent window of an overlying image sensor is reduced, light receiving sensitivities of the respective image sensors can be varied from each other. Alternatively, the level of an image signal read out from the respective image sensors is compensated for, and thereafter is supplied to a signal processor.

What is claimed is:

1. A solid state imaging device used to pick up a three-dimensional optical image of a three-dimensional object which is positioned before a lens section having a constant focal length and a constant focal depth, and which has a plurality of object points at different object distance along an optical axis of said lens section, said imaging device comprising;

a selected number of image sensing substrates, stacked along the optical axis so as to form a plurality of parallel focal surfaces, for becoming operative simultaneously to sense an optical image introduced thereonto through the lens section, and for generating two-dimensional image pickup signals which represent, respectively, just-focused image planes of the object points which are formed on the respective focal surfaces, each of said imago-sensing substrates comprising, a transparent layer for allowing incident image light to be transmitted to reach an underlying image sensing substrate; and a cell matrix having a plurality of picture elements which are formed on said transparent layer so as to be arranged at a predetermined interval, whereby said cell matrices are prevented from vertically overlapping each other along the optical axis, so that the three-dimensional image is sensed without moving the lens section.

2. The device according to claim 1, wherein the predetermined interval between the picture elements included in said cell matrix is increased in accordance with the selected number of said image sensing substrates.

3. The device according to claim 1, further comprising:

films sandwiched between said image sensing substrates, for preventing reflection from occurring when the incident image light is transmitted through the upper image sensing substrate of said stacked image sensing substrates and is incident on the lower image sensing substrate.

4. The device according to claim 3, wherein the selected number of said image sensing substrates is set to be an odd number.

* * * * *